June 17, 1969 J. V. DE MARINIS ET AL 3,450,834

AUTOMATIC GAIN CONTROL CIRCUIT

Filed March 4, 1966

INVENTORS
JOSEPH V. DE MARINIS &
BENTON B. SCOTT
BY
Robert E. Strauser
ATTORNEY 3,450,834
AUTOMATIC GAIN CONTROL CIRCUIT
Joseph V. De Marinis and Benton B. Scott, Batavia, N.Y., assignors to Sylvania Electric Products Inc., a corporation of Delaware
Filed Mar. 4, 1966, Ser. No. 531,955
Int. Cl. H04n *3/16, 5/38;* H04b *1/16*
U.S. Cl. 178—7.3 4 Claims

ABSTRACT OF THE DISCLOSURE

A transistor and a voltage dependent impedance and cascaded first and second voltage dividers selectively couple automatic gain control signals of equal rates and magnitudes below a received signal threshold level to first and second amplifier stages and of unequal rates and magnitudes above a given threshold value of received signals.

This invention relates to automatic gain control circuitry for signal receiving apparatus and more particularly to automatic gain control circuity for controlling the gain of different portions of receiving apparatus at different rates in accordance with received signal strength.

In prior art signal receiving apparatus and particularly in television receivers utilizing both radio frequency and intermediate frequency amplifier stages, numerous circuits have been suggested for automatically controlling the gain of the amplifier stages. For example, one known type of automatic gain control circuitry suggests the application of substantially equal control signals to both the radio frequency and intermediate frequency amplifier stages. Another well-known automatic gain control circuit provides for the application of a control signal to either one or the other of the amplifier stages in accordance with the strength of a received signal.

While such circuitry has provided satisfactory results in many types of apparatus, it has been found that each leaves much to be desired in presently available signal receiver apparatus such as television receivers. For instance, it has been found that automatic gain control systems wherein substantially equal control signals are applied to both the radio frequency and intermediate frequency amplifier stages have a tendency to overload one or more of the amplifier stages when a relatively strong signal is received and to lack the desired sensitivity upon receipt of a relatively weak signal.

Also, it has been found that automatic gain control circuitry wherein a control signal is shifted from one amplifier stage to another in accordance with the strength of a received signal is unduly complicated and expensive. Moreover, such circuitry provides substantially no control over either one or the other of the amplifier stages regardless of the signal strength. Obviously, such an operational condition leaves much to be desired in the areas of sensitivity, noise level, and maximum obtainable gain of the apparatus.

Therefore, it is an object of this invention to provide an automatic gain control circuit which exerts control over the gain of both a first and second amplifier stage regardless of the strength of a received signal.

Another object of the invention is to enhance the sensitivity of signal receiving apparatus by providing an improved automatic gain control circuit having simplicity of design and construction.

A further object of the invention is to provide an automatic gain control circuit for signal receiving appartus wherein control signals or bias potentials proportional to the intensity of a received signal are applied to the amplifier stages. When the received signal and the control signal is below a given threshold value, substantially the same magnitude and rate of control signal is applied to both the first and second amplifier stages. When the received signal and the control signals are above the given threshold value, substantially different magnitudes and rates of control signal are applied to the amplifier stages.

Briefly, these objects are achieved in one aspect of the invention by an automatic gain control circuit wherein a signal responsive transistor is directly coupled to a first signal amplifier stage, and by way of cascaded first and second voltage dividers and a voltage dependent impedance to a second signal amplifier stage. When the received signal and a developed control signal are below a given threshold value, the voltage dependent impedance is rendered conductive and substantially the same rate and magnitude of control signal is applied to both the first and second amplifiers. When the received signal and a developed control signal are above a given threshold value, the voltage dependent impedance is rendered nonconductive and substantially different rates and magnitudes of control signals are applied to each of the signal amplifier stages.

For a better understanding of the present invention, together with other and further objects, advantages and capabilities thereof, reference is made to the following disclosure and appended claims in connection with the accompanying drawing in which:

Figure 1:
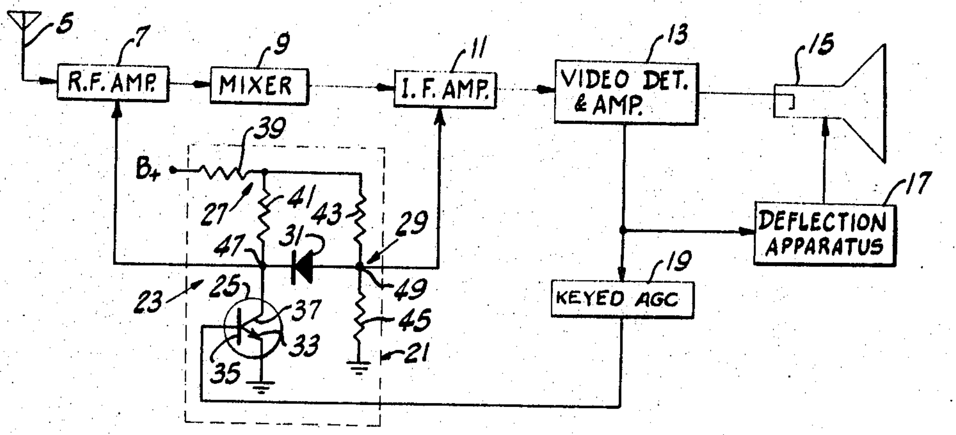
FIG. 1 is a diagrammatic representation, partly in block form of a portion of a signal receiving apparatus employing an automatic gain control circuit in accordance with one embodiment of the invention.

Referring to the drawings, FIG. 1 is a diagrammatic illustration, partly in block and partly in schematic form, of portions of a television receiver. While a television receiver is utilized for illustrating the automatic gain control circuit, it is to be understood that such circuitry is no way limited to such receivers and is equally applicable to other signal receiving apparatus.

Generally speaking, the television receiver is of conventional design and includes an antenna 5 for intercepting a transmitted television signal. The antenna 5 is coupled to a tuner which includes an R.F. amplifier 7 and mixer stage 9 wherein the received signal is amplified and then converted to an intermediate frequency.

The intermediate frequency signal is amplified by the intermediate frequency amplifier stage 11 and applied to a video detector and amplifier stage 13 wherein a video signal is derived and applied to a cathode ray tube 15. The video signal is also applied to the usual deflection apparatus 17 associated with the cathode ray tube 15 and to an automatic gain control keyer stage 19. The keyer stage 19 is a typical gated amplifier and provides a D.C. potential having a magnitude and rate of variation inversely proportional to the strength of the signal intercepted by the antenna 5.

This varying D.C. potential is applied to an automatic gain control circuit 21 which includes a circuit network 23 having a transistor 25, a first voltage divider 27, a second voltage divider 29, and a voltage dependent impedance 31. The transistor 25 has an emitter electrode 33, a base or control electrode 35, and a collector or output electrode 37. The emitter electrode 33 is connected to a reference voltage level and the output electrode is connected through the first voltage divider 27 to a potential source B+.

The first voltage divider 27 includes a pair of series connected resistors 39 and 41 and the second voltage divider 29 includes a pair of series connected resistors 43 and 45. The second voltage divider 29 is connected intermediate the junction of the resistors 39 and 41 and a voltage reference level. The voltage dependent impedance 31 is coupled between the junction 47 of the transistor 25 and first voltage divider 27 and a junction 49 of the series connected resistors 43 and 45 of the second voltage divider 29.

The junction 47 of the transistor 25 and first voltage divider 27 is connected to the radio frequency amplifier stage 7 while the junction 49 of the series connected resistors 43 and 45 is connected to the intermediate frequency amplifier stage 11. Also, the base or control electrode 35 of the transistor 25 is directly connected to the automatic gain control keyer stage 19 which provides a D.C. potential inversely proportional to the strength of a received signal.

As to the operation of the automatic gain control circuit 21, a varying D.C. potential inversely proportional to a received signal is applied to the base electrode 35 of the transistor 25 causing a current flow therethrough in an amount dependent upon the rate and magnitude of the applied signal. Thus, the potential at the output electrode 37 of the transistor 25, which is the junction 47, is accordingly altered and applied in the form of a control signal to the first or R.F. amplifier stage 7.

Referring to the control signals for the second or I.F. amplifier stage 9, the component values of the first and second voltage dividers 27 and 29 respectively are chosen such that a predetermined potential is applied to the voltage dependent impedance 31 and desired relative rates of control are exerted on the first and second amplifier stages 7 and 11. When the above-mentioned potential appearing at the junction 47 is below a given threshold value due to the rate and magnitude of the signal applied to the control electrode 35 of the transistor 25, the voltage dependent impedance 31 is rendered conductive. Thereupon, the previously mentioned control signal applied to the first or R.F. amplifier stage 7 is also applied to the second or I.F. amplifier stage 11.

Further, when the signal intercepted by the receiver and consequently the signal applied to the base electrode 35 of the transistor 25 is of a value such that the altered potential appearing at the junction 47 is above a given threshold value, the voltage dependent impedance 31 is rendered non-conductive. At such a time, the control signal appearing at the junction 49 and applied to the second or I.F. amplifier 11 is substantially different in magnitude and rate of change from the control signal appearing at the junction 47 and applied to the first or R.F. amplifier 7 due to the impedance of the cascaded first and second voltage dividers 27 and 29 respectively.

As explained above, the potential appearing at the junction 47 is dependent upon the D.C. potential applied to the control electrode 35 which is, in turn, dependent upon the strength of the received signal. Further, the conduction of the voltage dependent impedance 31 is also dependent upon the potential appearing at the junction 47. Thus, the potentials available at various junctions of the circuit are dependent upon both the predetermined values and characteristics of the components and the potential at the junction 47 which is dependent upon the potential applied to the base electrode 35 of the transistor 25 and, in turn, to the strength of the signal received.

Figure 2:
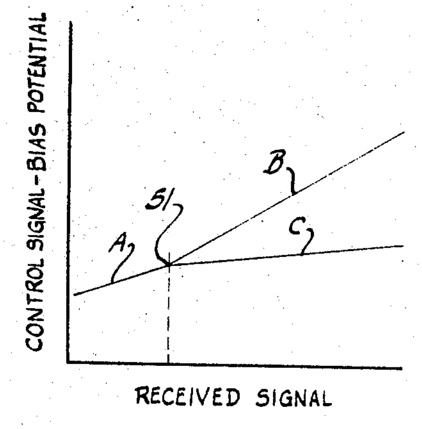
FIG. 2 illustrates the control signals developed in accordance with the intensity of a received signal and applied to the signal amplifier stages of a signal receiving apparatus.

In other words, receipt of a relatively weak signal by the receiver causes the development and application of a relatively large D.C. potential to the control electrode 35 of the transistor 25. In turn, the control signal or bias potential appearing at the junction 47 is below a given threshold value, 51 of FIG. 2, causing the voltage dependent impedance 31 to be rendered conductive and the application of substantially the same rate and magnitude of control potential, A of FIG. 2, to both the first or R.F. amplifier stage 7 and to the second or I.F. amplifier stage 11.

On the other hand, receipt of a relatively strong signal by the receiver causes the development and application of a relatively small D.C. potential to the control electrode 35 of the transistor 25. This relatively small D.C. potential, in turn, causes the development of a control signal or bias potential at the junction 47 having a value above a given threshold value, 51 of FIG. 2. As a result, the voltage dependent impedance 31 is rendered non-conductive and a control or bias potential, B of FIG. 2, having one rate and magnitude is applied to the first or R.F. amplifier stage 7 while a control or bias potential, C of FIG. 2, having a substantially different rate and magnitude is applied to the second or I.F. amplifier stage 11.

In accordance with the above-mentioned control signals, gain control is exerted on both the first or R.F. amplifier stage 7 and the second or I.F. amplifier stage 11 regardless of the relative strength of the received signal. For example, the employment of the automatic gain control circuit 21 in a receiver utilizing presently available high-gain transistorized circuitry in both the first and second amplifier stages 7 and 11 respectively provides a gain response substantially as illustrated in FIG. 3.

Figure 3:
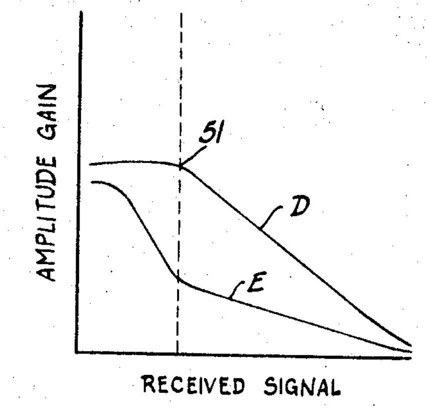
FIG. 3 is an illustration of the gain of the amplifier stages of a signal receiving apparatus in accordance with the intensity of a received signal.

In FIG. 3, it can readily be seen that the gain control, curve D, exerted on the first or R.F. amplifier stage 7 is much less than the gain control, curve E, exerted on the second or I.F. amplifier stage 11 for received signals and control bias potentials below a given threshold value 51. Moreover, as the received signal and control potential increases above the threshold value 51, the gain control, curve D, exerted on the first amplifier 7 is at an increased rate of change while the gain control curve E, exerted on the second amplifier 11 is at a reduced rate of change.

Thus, there has been provided an automatic gain control circuit of uncomplicated design and construction which exerts gain control on different amplifier stages when a received signal is either relatively weak or relatively strong. Such control has provided a receiver having a sensitivity and noise level upon receipt of relatively weak signals which is unexpected and believed to be unobtainable in any other known circuitry of reasonable simplicity. Further, these desirable features have been obtained without overloading of the receiver when the received signal is of relatively high intensity.

While there has been shown and described what is at present considered the preferred embodiment of the invention, it will be obvious to those skilled in the art that various changes and modifications may be made therein without departing from the invention as defined by the appended claims.

What is claimed is:

1. In a signal receiving apparatus including first and second signal amplifier stages and a means for developing a signal potential inversely proportional to a received signal, an automatic gain control circuit comprising:

- a circuit network having a first voltage divider and a transistor connected in series between a voltage source and a reference potential level, said voltage divider including a pair of impedances connected in series and said transistor including a control electrode;
- a second voltage divider including a pair of impedances connected in series between the junction of said impedances of said first voltage divider and a reference potential level;
- a voltage dependent impedance connecting the junction of said first voltage divider and said transistor and the junction of said impedances of said second voltage divider;
- circuit means connecting the junction of said first voltage divider and said transistor to said first signal amplifier stage and the junction of said impedances of said second voltage divider to said second amplifier stage; and means for impressing said signal potential from said signal potential developing means to said control electrode of said transistor causing the development by said transistor of control signals having a threshold value below which said unidirectional conduction device is rendered conductive causing the application of substantially the same rate and magnitude of control signals to said first and said second amplifier stages and above which said unidirectional conduction device is rendered non-conductive causing the application of substantially different rates and magnitudes of control signals to said first and said second amplifier stages.

2. The automatic gain control circuit of claim 1 wherein the signal receiving apparatus is a television receiver, the first and second amplifier stages are radio frequency and intermediate frequency amplifier stages respectively, and the impedances of the first and second voltage dividers are resistors.

3. The automatic gain control circuit of claim 1 wherein said voltage dependent impedance is a unidirectional conduction device.

4. The automatic gain control circuit of claim 3 wherein said unidirectional conduction device is a diode.

References Cited

UNITED STATES PATENTS

| | | | |
|---|---|---|---|
| 3,344,355 | 9/1967 | Massman | 325—405 |
| 3,205,444 | 9/1965 | Birkenes | 325—404 |
| 2,834,877 | 5/1958 | Milwitt | 325—405 |

OTHER REFERENCES

Towers: Transistor Television Receivers, 1963, page 7.

ROBERT L. GRIFFIN, *Primary Examiner.*

ROBERT L. RICHARDSON, *Assistant Examiner.*

U.S. Cl. X.R.

325—410